US012656428B2

(12) United States Patent
Sakakura

(10) Patent No.: US 12,656,428 B2
(45) Date of Patent: Jun. 16, 2026

(54) STATIC FIELD MAGNET AND MRI APPARATUS

(71) Applicant: CANON KABUSHIKI KAISHA, Tokyo (JP)

(72) Inventor: Yoshitomo Sakakura, Nasushiobara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 97 days.

(21) Appl. No.: 18/544,785

(22) Filed: Dec. 19, 2023

(65) Prior Publication Data

US 2024/0230803 A1     Jul. 11, 2024

(30) Foreign Application Priority Data

Jan. 10, 2023     (JP) ................................. 2023-001782

(51) Int. Cl.
*G01R 33/341*          (2006.01)

(52) U.S. Cl.
CPC .................................. *G01R 33/341* (2013.01)

(58) Field of Classification Search
None
See application file for complete search history.

(56) References Cited

U.S. PATENT DOCUMENTS 5,744,960 A  *  4/1998  Pulyer ................ G01R 33/3808
                                                          324/319
5,764,059 A  *  6/1998  Mansfield .......... G01R 33/3854
                                                          324/318

6,288,624 B1  *  9/2001  Savelainen ............... H01F 7/20
                                                          335/216
2004/0085170 A1  *  5/2004  Kruip ................. G01R 33/3806
                                                          335/299
2010/0013418 A1  *  1/2010  Kruip ..................... A61B 5/055
                                                          250/492.3
2011/0273177 A1  *  11/2011  McGinley ............ G01R 33/381
                                                          324/318
2023/0375648 A1  *  11/2023  Sakakura ............... G01R 33/38

FOREIGN PATENT DOCUMENTS

EP          1464975 A1  *  10/2004  ....... G01R 33/34053
JP          H09168527 A  *  6/1997  ......... G01R 33/3806
JP          3808818 B2      8/2006

* cited by examiner

*Primary Examiner* — Rodney E Fuller
(74) *Attorney, Agent, or Firm* — Oblon, McClelland, Maier & Neustadt, L.L.P.

(57)          ABSTRACT

A static field magnet includes at least one loop coil pair including: a first loop coil to be supplied with an electric current in a first direction; and a second loop coil to be supplied with an electric current in a second direction, wherein: the first and second loop coils are arranged such that a first coil plane surrounded by a first loop forming the first loop coil and a second coil plane surrounded by a second loop forming the second loop coil are arranged along a specific direction in a specific plane without overlapping each other; the loop coil pair generates a static magnetic field parallel to the specific direction; and each of the first and second loop coils is formed such that a side along its major axis direction has a concave portion curved toward coil interior and toward its minor axis direction.

13 Claims, 15 Drawing Sheets

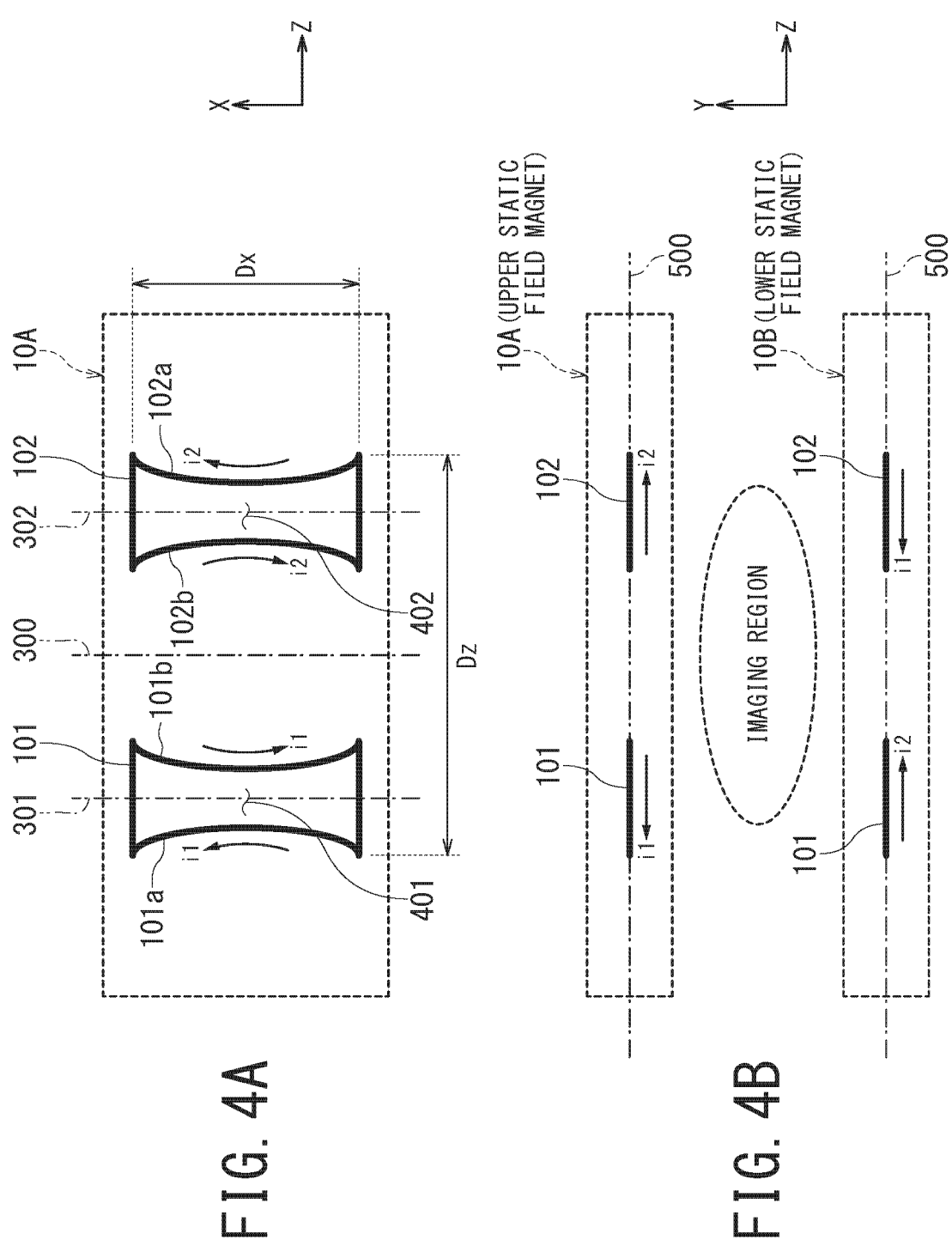

STATIC FIELD MAGNET AND MRI APPARATUS

CROSS-REFERENCE TO RELATED APPLICATION

This application is based upon and claims the benefit of priority from Japanese Patent Application No. 2023-001782, filed on Jan. 10, 2023, the entire contents of which are incorporated herein by reference.

FIELD

Disclosed embodiments relate to a static field magnet and a magnetic resonance imaging (MRI) apparatus.

BACKGROUND

An MRI apparatus is an imaging apparatus that magnetically excites nuclear spin of an object placed in a static magnetic field with a radio frequency (RF) signal having the Larmor frequency and reconstructs an image based on magnetic resonance (MR) signals emitted from the object due to the excitation.

Many MRI apparatuses have a configuration called a gantry which forms a cylindrical space called a bore. Imaging of an object (for example, a patient) lying on a table is performed in a state where the table is moved into the cylindrical space. Inside the gantry, a cylindrical static field magnet, a cylindrical gradient coil, and a cylindrical transmitting/receiving coil (i.e., WB (Whole Body) coil) are housed. This structure of many conventional MRI apparatuses, in which the static field magnet, the gradient coil, and the transmitting/receiving coil are cylindrical, is hereinafter referred to as a cylindrical MRI apparatus. The term "static field magnet" means a magnet for generating a static magnetic field.

In the cylindrical MRI apparatus, imaging is performed in the closed space inside the bore, and thus, imaging may be difficult for some patients having claustrophobia, for example.

In another structure of MRI apparatus having been proposed and developed, for example, two cylindrical static field magnets are arranged on the respective upper and lower sides with their central axes aligned in the vertical direction, and imaging of the object lying on the table is performed in the open space sandwiched between the two static field magnets from above and below. Hereinafter, an MRI apparatus of this structure is referred to as an open MRI apparatus. In the open MRI apparatus, imaging is performed in the relatively open space, and thus, even a patient having claustrophobia can be imaged.

In the conventionally proposed open MRI apparatus, the coils (for example, superconducting coils) built into the respective upper and lower static field magnets are circular loop coils, and the upper circular loop coil and the lower circular loop coil are arranged coaxially with each other such that their coil planes are horizontal. Since the upper and lower loop coils are circular, the shape of the horizontal cross-section of the imaging region formed by the two static field magnets is circular.

Accordingly, in the case of trying to expand the imaging region of a lying object in the head-foot direction of the object, the diameter of each of the upper and lower circular loop coils has to be increased. Consequently, the diameter of each of the upper and lower static field magnets is also increased, which gives the object a sense of being confined in a closed space.

Further, increase in diameter of the upper and lower static field magnets makes it difficult to access the object, when performing a medical procedure such as percutaneous coronary intervention (PCI) on the object during imaging.

BRIEF DESCRIPTION OF THE DRAWINGS

In the accompanying drawings:

FIG. 4A is a plan view illustrating an internal configuration of an upper static field magnet;

FIG. 4B is a side view illustrating respective internal configurations of upper and lower static field magnets;

DETAILED DESCRIPTION

Hereinbelow, embodiments of the present invention will be described by referring to the accompanying drawings.

In one embodiment, a static field magnet used in an MRI apparatus configured to image an object includes at least one loop coil pair that includes: a first loop coil configured to be supplied with an electric current in a first direction; and a second loop coil configured to be supplied with an electric current in a second direction opposite to the first direction, wherein: the first and second loop coils are arranged in such a manner that a first coil plane and a second coil plane are along a specific direction included in a specific plane without overlapping each other, the first coil plane being a planar area surrounded by a first loop that forms the first loop coil, the second coil plane being a planar area surrounded by a second loop that forms the second loop coil; the loop coil pair is configured to generate a static magnetic field parallel to the specific direction; and each of the first and second loop coils is formed into a shape having a major axis and a minor axis in such a manner that a side along a major axis direction has a concave portion curved toward inside of a coil and toward a minor axis direction.

Static Field Magnet

Figure 1:
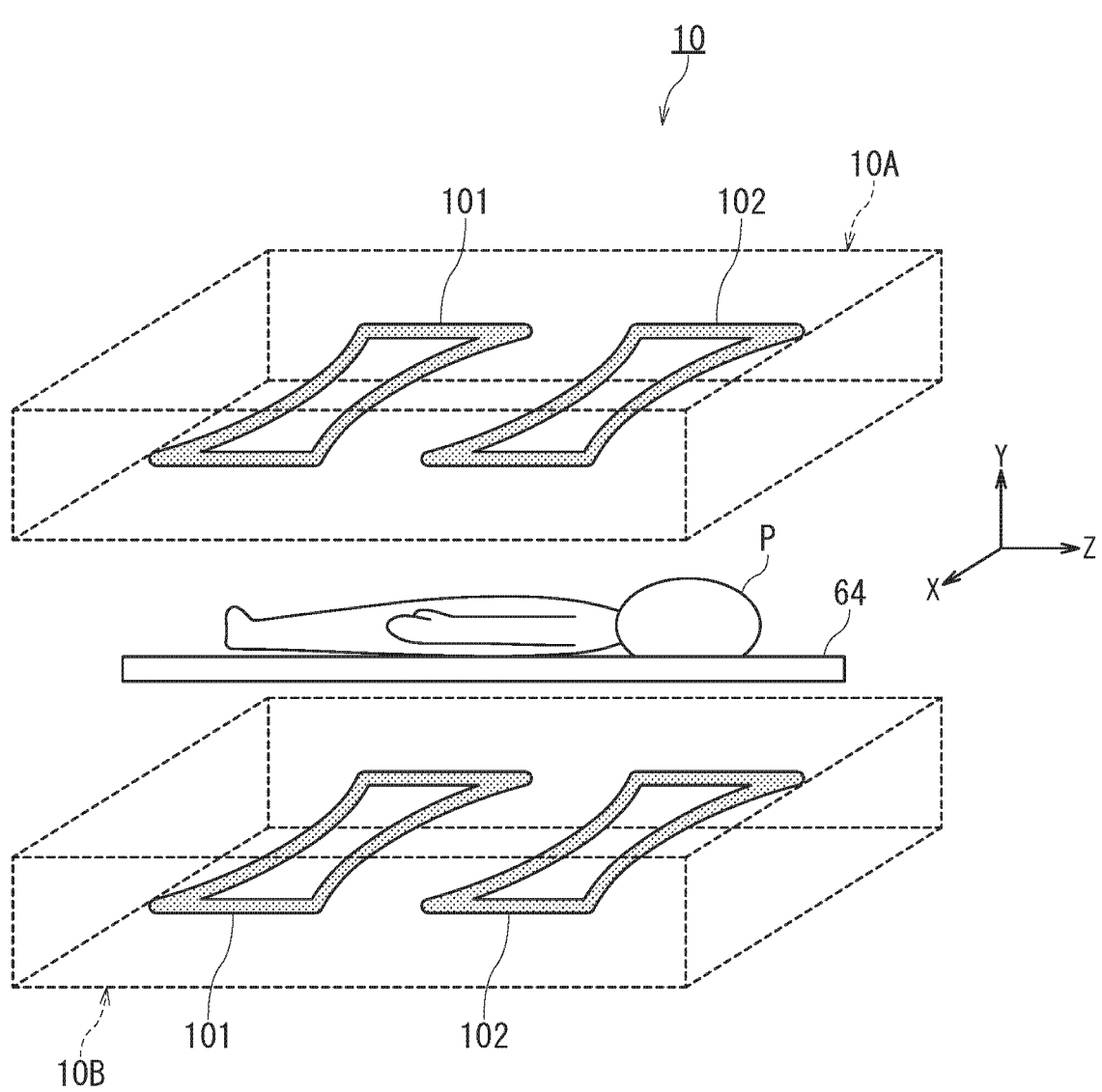
FIG. 1 is a schematic diagram illustrating a configuration concept of an open-type static field magnet used in an MRI apparatus according to the present embodiment.

FIG. 1 is a schematic diagram illustrating a configuration concept of an open-type static field magnet 10 used in an MRI apparatus 1 (FIG. 15) according to the present embodiment. As illustrated in FIG. 1, the static field magnet 10 has, for example, two rectangular parallelepiped or rectangular cuboid) static field magnets 10A and 10B.

The imaging space of the MRI apparatus 1 is the space between the two static field magnets 10A and 10B. For example, when an object P lies on its back on a table 64, imaging of the object P can be performed in such a manner that the head-foot direction of the object P matches the longitudinal direction of the static field magnet 10 and the right-left direction of the object P matches the lateral direction of the static field magnet 10.

Each of the static field magnets 10A and 10B contains at least one loop coil pair composed of a first loop coil 101 and a second loop coil 102. Although FIG. 1 illustrates a configuration in which one loop coil pair is contained, as described below, the number of loop coil pairs may be two or more (in this case, the number of loop coils is four or more).

The static field magnet 10 maybe configured as a superconducting magnet or as a normal conducting magnet (i.e., resistive magnet).

When the static field magnet 10 is configured as a superconducting magnet, each of the first and second loop coils 101 and 102 can be configured as an ultra-fine multifilamentary wire structure in which a superconducting material such as niobium titanium (Nb—Ti) is made into many thin filaments, and embedded in a normal-conduction base material such as copper. Each of the first and second loop coils 101 and 102 is submerged in a liquid helium container (not shown) filled with liquid helium, for example.

Further, when the static field magnet 10 is configured as a superconducting magnet, a static magnetic field is generated by applying electric currents supplied from a magnet power supply 40 (FIG. 15) to the respective first and second loop coils 101 and 102 in an excitation mode, and afterward, the magnet power supply is disconnected when the static field magnet 10 shifts to a persistent current mode.

When the static field magnet 10 is configured as a normal-conducting magnet (resistive magnet), each of the first and second loop coils 101 and 102 is composed of a normal-conducting wire material such as copper, and generates a static magnetic field by using an electric current supplied from the magnet power supply.

Figure 2:
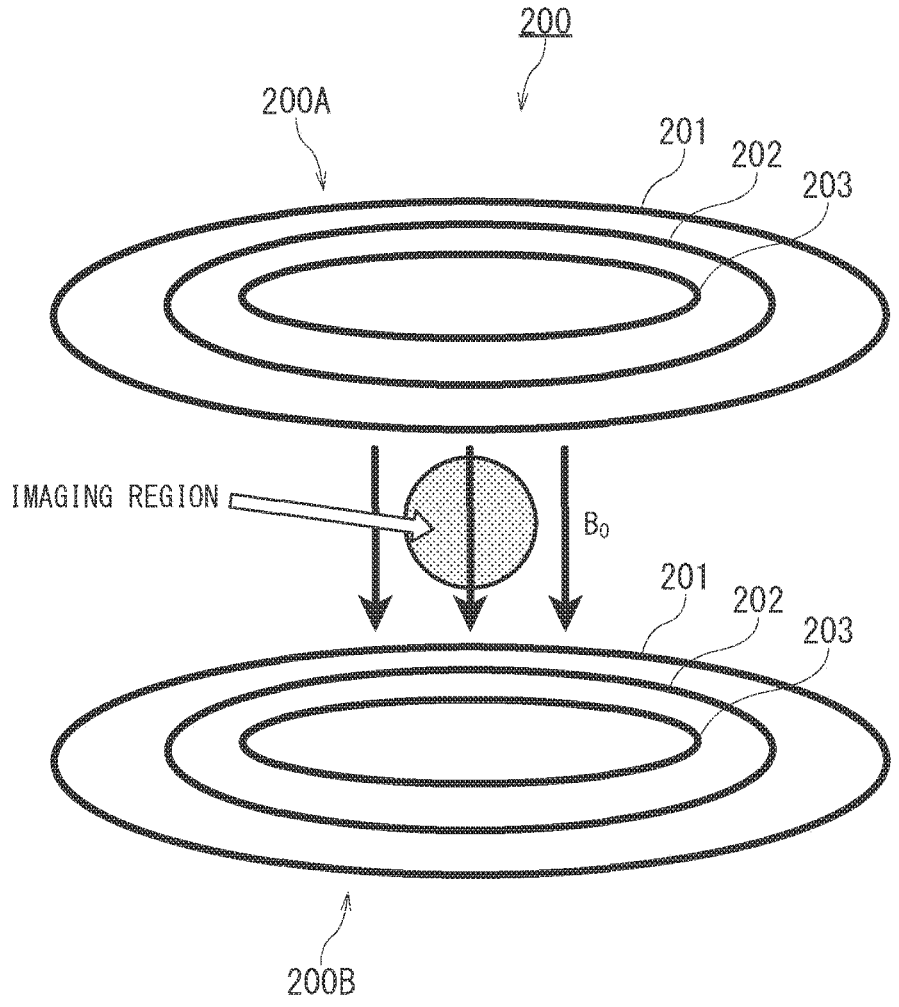
FIG. 2 is a schematic diagram illustrating a configuration of a conventional open-type static field magnet.

FIG. 2 is a schematic diagram illustrating a configuration of a conventional open-type static field magnet 200 as a comparative example with respect to the static field magnet 10 of the present embodiment. The conventional open-type static field magnet includes an upper static field magnet 200A and a lower static field magnet 200B. Each of the upper and lower static field magnets 200A and 200B is provided with one or more circular loop coils, for example, three circular loop coils 201, 202, 203. The upper circular loop coils 201, 202, 203 and the lower circular loop coils 201, 202, 203 are arranged coaxially with each other such that their coil planes are horizontal. The term "coil plane" means a planar area surrounded by a loop that forms a loop coil. The conventional open-type static field magnet 200 has such a configuration, and thus can generate a static magnetic field $B_0$ in the direction orthogonal to each coil plane.

Since each of the upper and lower loop coils 201, 202, and 203 are circular, the shape of the horizontal cross-section of the imaging region formed by the two static field magnets 200A and 200B is also circular. For this reason, when the imaging region of a lying or recumbent object is expanded in the head-foot direction of the object, the diameter of each of the upper and lower circular loop coils 201, 202, 203 must be increased. As a result, the diameter of each of the upper and lower static field magnets 200A and 200B becomes large, which gives the object a sense of being confined in a closed space.

In addition, if the diameter of each of the upper and lower static field magnets 200A and 200B is increased, it becomes difficult to access the object from any direction, when performing a medical procedure such as PCI on the object.

Figure 3:
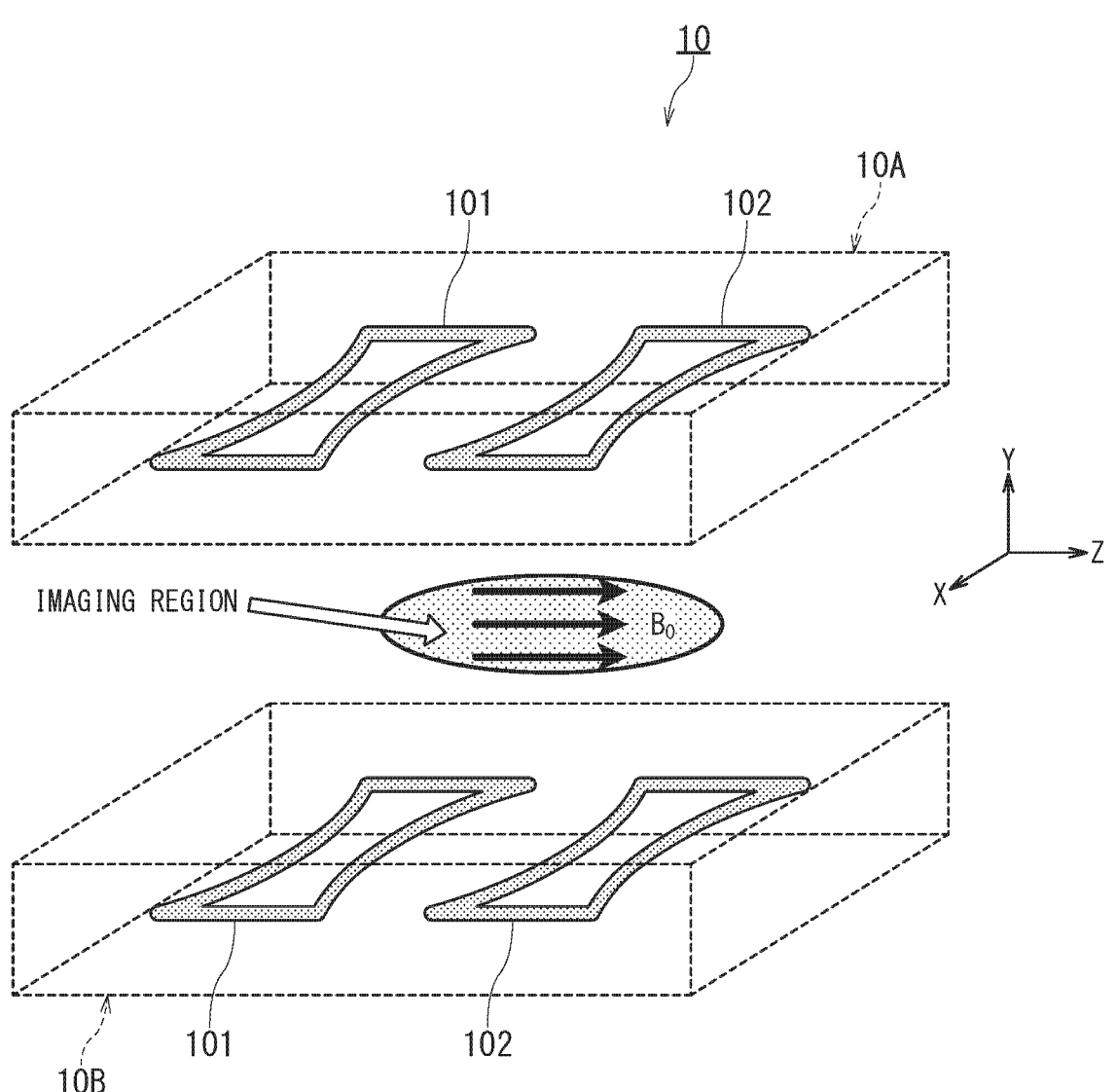
FIG. 3 is a schematic diagram illustrating a configuration of the static field magnet according to the present embodiment.

FIG. 3 is a schematic diagram illustrating a configuration of the static field magnet 10 according to the present embodiment. The static field magnet 10 of the present embodiment is configured of the upper and lower static field magnets 10A and 10B. As described above, the static field magnet 10 includes two rectangular parallelepiped static field magnets 10A and 10B, for example, and the space between the two static field magnets 10A and 10B is the imaging region of the MRI apparatus 1.

Each of the static field magnets 10A and 10B contains a plurality of loop coils, for example, a loop coil pair composed of a first loop coil 101 and a second loop coil 102. These plurality of loop coils are arranged along the longitudinal direction of the rectangular parallelepiped static field magnets 10A and 10B such that the respective coil planes (i.e., planar area surrounded by the loop forming each loop coil) do not overlap each other. This arrangement enables formation of an asymmetrically shaped imaging region that is wider in the longitudinal direction of the static field magnets 10A and 10B and narrower in the lateral direction of the static field magnets 10A and 10B.

In other words, when the plurality of loop coils are arranged along a specific direction on a specific plane such that the respective coil planes do not overlap each other, each of the static field magnets 10A and 10B accommodating the plurality of loop coils can be formed into a rectangular parallelepiped shape in which: (a) the direction orthogonal to the specific plane is the thickness direction, (b) the specific direction is the longitudinal direction, and (c) the direction orthogonal to both the thickness direction and the longitudinal direction is the lateral direction.

As a result, when the object is imaged in a recumbent posture such that the head-foot direction of the object matches the longitudinal direction of the static field magnet 10, the object can be easily accessed from the lateral direction of the static field magnet 10, which facilitates a medical procedure such as PCI during imaging.

When imaging is performed such that the lateral direction of the rectangular parallelepiped static field magnets 10A and 10B matches the left-right direction (or anterior-posterior direction) of the object, the feeling of oppression and occlusion on the object is significantly reduced as compared with the conventional static field magnet 200.

FIG. 4A and FIG. 4B illustrate the configuration of the static field magnet 10 according to the present embodiment in more detail. FIG. 4A is a plan view illustrating the internal configuration of the upper static field magnet 10A, and FIG. 4B is a side view illustrating the respective internal configurations of the upper and lower static field magnets 10A and 10B.

Each of the upper and lower static field magnets 10A and 10B includes the loop coil pair composed of the first loop coil 101 and the second loop coil 102.

As shown in FIG. 4A, a first coil plane 401 is a planar area surrounded by a first loop that forms the first loop coil 101, a second coil plane 402 is a planar area surrounded by a second loop that forms the second loop coil 102, and the first coil plane 401 and the second coil plane 402 are arranged side by side along a specific direction (i.e., a primary direction) of a specific plane (i.e., a primary plane) 500 so as not to overlap each other.

Each of the first and second loop coils 101 and 102 has a loop shape defined by a major axis and a minor axis, and is formed such that the side along the major axis direction has a concave portion curved toward the inside of the coil and toward the minor axis direction.

In other words, the first and second loop coils 101 and 102 are formed in a loop shape with different aspect ratios, and each of the first and second loop coils 101 and 102 is formed in such a manner that the portion along the longitudinal direction of its loop shape has a concave portion curved toward the inside of the coil.

Further, the first and second loop coils 101 and 102 are formed in a line-symmetrical shape with respect to the center axis 300, which is set on the specific plane 500 and set at a center between the first and second loop coils 101 and 102.

Furthermore, in other words, each of the first and second loop coils 101 and 102 is formed into a deformed rectangular shape having two opposing long sides and two opposing short sides such that at least one of the two opposing long sides is formed as a concave portion curved toward the inside of the deformed rectangle.

For example, as shown in FIG. 4A, the two opposing long sides 101a and 101b of the first loop coil 101 are formed as arc-shaped concave portions curved inward, and similarly, the two opposing long sides 102a and 102b of the second loop coil 102 are also formed as arc-shaped concave portions curved inward.

In the embodiment shown in FIG. 4A and FIG. 4B, the arcs of the two opposing long sides 101a and 101b of the first loop coil 101 are formed as arcs having the same radius, and the shape of the two long sides 101a and 101b is line-symmetric (i.e., axisymmetric) with respect to the major axis 301. Similarly, the arcs of the two opposing long sides 102a and 102b of the second loop coil 102 are formed as arcs having the same radius, and the shape of the two long sides 102a and 102b is line-symmetric with respect to the major axis 302.

The first and second loop coils 101 and 102 have the major axes 301 and 302 approximately at the center of the first and second coil surfaces 401 and 402, respectively. The above-described specific plane 500 is a plane that includes the respective major axes 301 and 302 of the first and second loop coils 101 and 102 constituting the loop coil pair. Further, the above-described specific direction is a direction orthogonal to each of the two major axes 301 and 302 within the specific plane 500.

As described above, the first and second loop coils 101 and 102 are arranged line-symmetrically with respect to the center axis 300 of the loop coil pair composed of the first and second loop coils 101 and 102. The length Dz of the loop coil pair in the longitudinal direction corresponds to the maximum width of the outer circumference of the loop coil pair in the Z-axis direction, and the length Dx of the loop coil pair in the lateral direction corresponds to the maximum width of the outer circumference of the loop coil pair in the X-axis direction.

In FIG. 4A and FIG. 4B, among the X-axis, Y-axis, and Z-axis orthogonal to each other, the Z-axis direction is selected as the above-described specific direction, the X-axis direction is selected as the direction parallel to the major axes 301 and 302, and the Y-axis direction is selected as the direction orthogonal to the specific plane 500. This relationship is the same in FIG. 5A to FIG. 15 described below.

As shown in FIG. 4B, the loop coil pair of the upper static field magnet 10A (i.e., first loop coil pair) is disposed on a first specific plane 500 (i.e., the specific plane 500 included in the upper static field magnet 10A in FIG. 4B), and the loop coil pair of the lower static field magnet 10B (i.e., second loop coil pair) is disposed on a second specific plane 500 (i.e., the specific plane 500 included in the lower static field magnet 10B in FIG. 4B).

As shown in FIG. 4A, in the upper static field magnet 10A, the first loop coil 101 is supplied with an electric current i1 in a first direction (for example, the clockwise direction on the sheet of FIG. 4A) while the second loop coil 102 is supplied with an electric current i2 in a second direction (for example, the counterclockwise direction on the sheet of FIG. 4A), which is opposite to the first direction.

The lower static field magnet 10B is supplied with electric currents in the directions opposite to that of the respective first and second loop coils 101 and 102 of the upper static field magnet 10A. In other words, in the lower static field magnet 10B, the first loop coil 101 is supplied with the electric current i2 in the second direction while the second loop coil 102 is supplied with the electric current i1 in the first direction.

Since the electric currents flow through the first and second loop coils 101 and 102 of the upper and lower static field magnets 10A and 10B in the above-described directions, in the imaging region between the upper and lower static field magnets 10A and 10B, a static magnetic field $B_0$ parallel to the above-described specific direction (i.e., the Z-axis direction in FIG. 4A and FIG. 4B) can be generated (FIG. 3).

Since the electric currents flow through the first and second loop coils 101 and 102 of the upper and lower static field magnets 10A and 10B in the above-described directions, in the imaging region between the upper and lower static field magnets 10A and 10B, the static magnetic field can be generated with magnetic field strength distribution that is uniformized in the three orthogonal directions including: (a) the specific direction (i.e., the Z-axis direction in FIG. 4A and FIG. 4B), (b) the direction orthogonal to the specific plane 500 (i.e., the Y-axis direction in FIG. 4A and FIG. 4B), and (c) the direction parallel to the specific plane 500 and orthogonal to the specific direction (i.e., the X-axis direction in FIG. 4A and FIG. 4B).

Modifications of Static Field Magnet

Hereinafter, a description will be given of several modifications of the static field magnet 10 by using FIG. 5A to FIG. 10B.

Figures 5A, 5B:
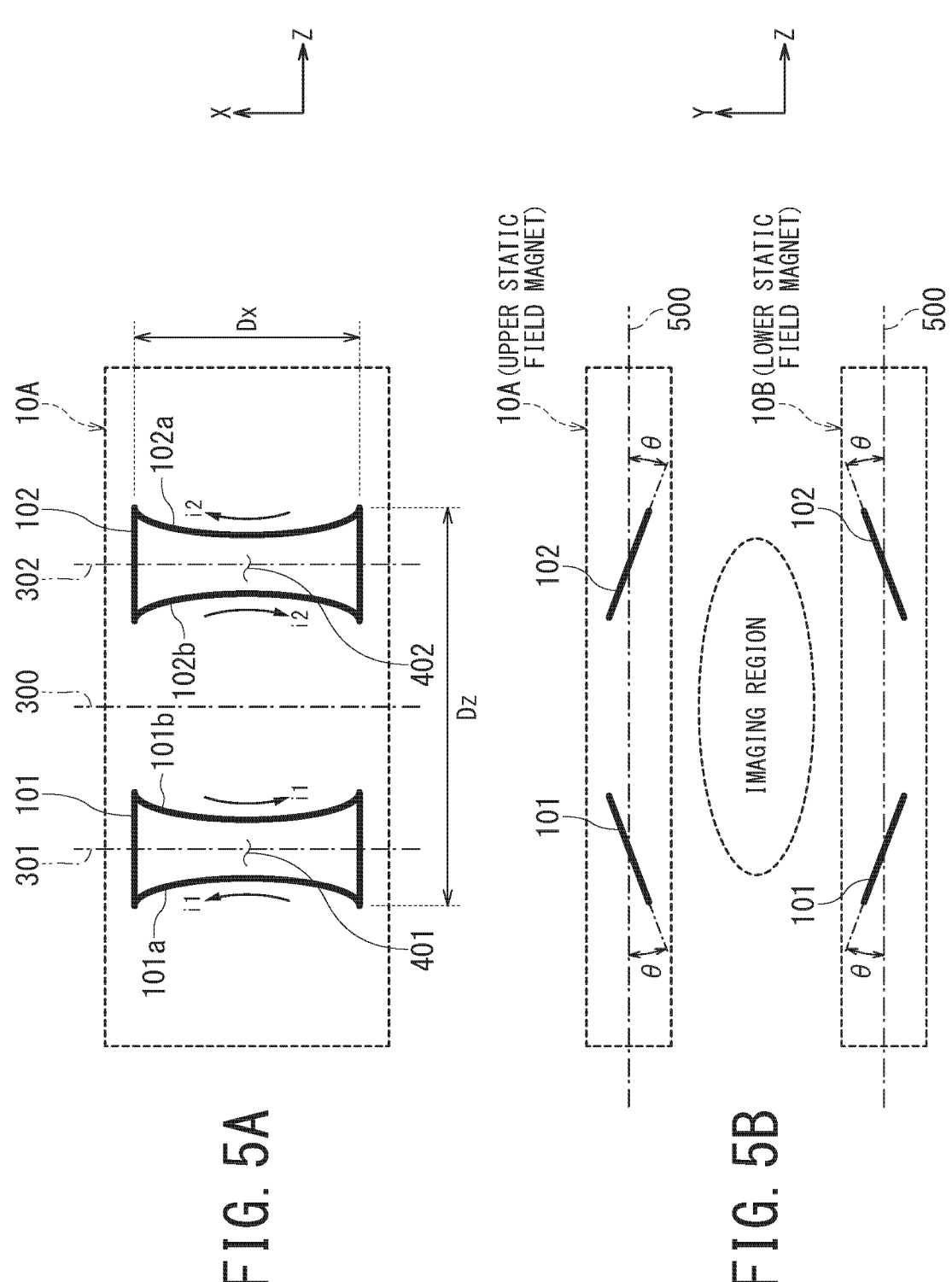
FIG. 5A and FIG. 5B are schematic diagrams illustrating a configuration of the static field magnet according to the first modification.

FIG. 5A and FIG. 5B are schematic diagrams illustrating a configuration of the static field magnet 10 according to the first modification. In the static field magnet 10 of the above-described embodiment shown in FIG. 4A and FIG. 4B, in both the upper and lower static field magnets 10A and 10B, the first and second loop coils 101 and 102 are arranged such that the first and second coil planes 401 and 402 are included in the specific plane 500.

By contrast, in the first modification, the first and second loop coils 101 and 102 are arranged such that the first and second coil planes 401 and 402 are tilted with respect to the specific plane 500 at a predetermined tilt angle θ around the respective major axes 301 and 302. The tilt angle θ of the first coil plane 401 with respect to the specific plane 500 and the tilt angle θ of the second coil plane 402 with respect to the specific plane 500 have the same absolute value and are opposite in direction to each other. Since the first and second coil planes 401 and 402 are tilted with respect to the specific plane 500 in this manner, degree of freedom of the static magnetic field distribution to be formed can be enhanced and a wider uniform static-magnetic-field region can be obtained.

Figure 6A:
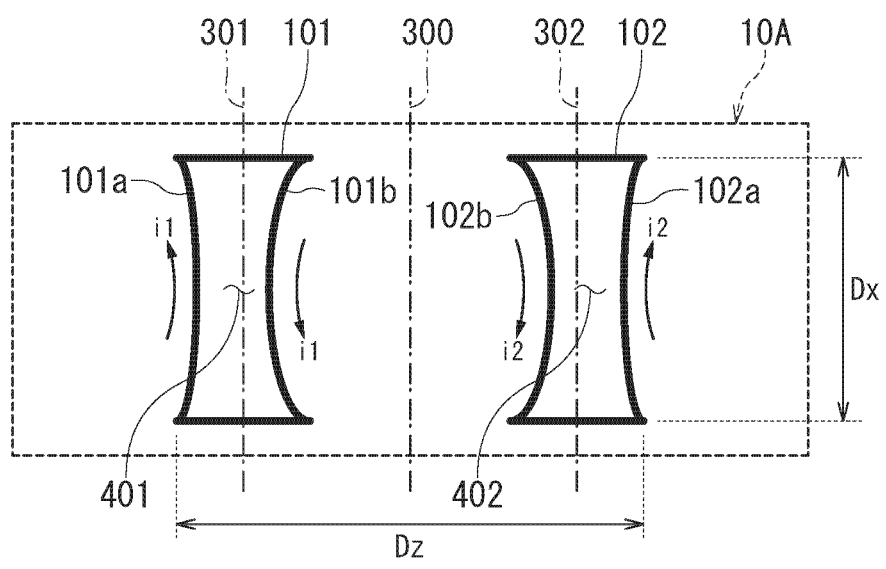
FIG. 6A is a schematic diagram illustrating a configuration of the static field magnet according to the second modification.
Figure 6B:
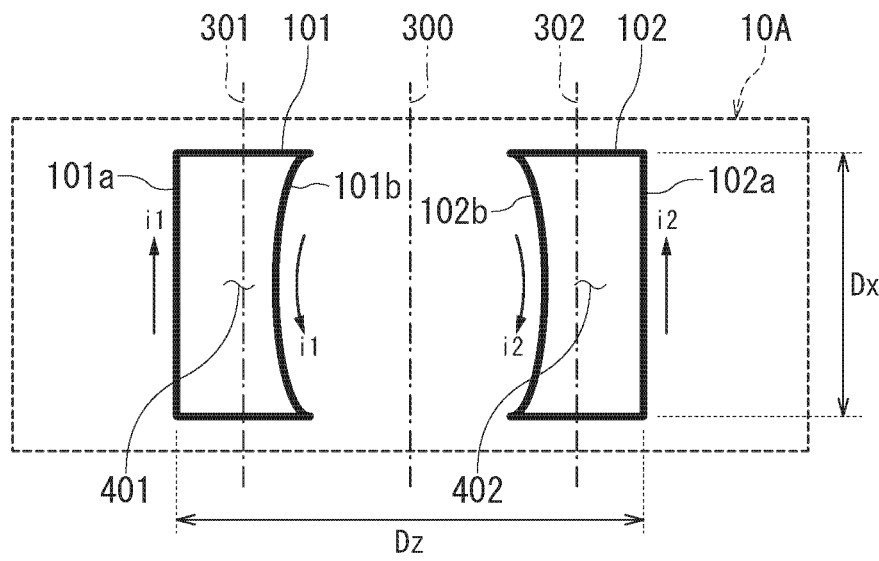
FIG. 6B is a schematic diagram illustrating a configuration of the static field magnet according to the third modification.

FIG. 6A and FIG. 6B are schematic diagrams illustrating a configuration of the static field magnet 10 according to the second modification. In the second modification, only the upper static field magnet 10A is illustrated because the configuration and structure of the upper static field magnet 10A and the lower static field magnet 10B are the same as each other.

Note that, in the static field magnet 10 of the embodiment as shown in FIG. 4A and FIG. 4B, the first and second loop coils 101 and 102 are formed such that: (a) the arcs of the two opposing long sides 101a and 101b are the same in radius, (b) the arcs of the two opposing long sides 102a and 102b are the same in radius, (c) the shapes of the two long sides 101a and 101b are line-symmetrical with respect to the major axis 301, and (d) the shapes of the two long sides 102a and 102b are line-symmetrical with respect to the major axis 302. However, the shapes of the first and second loop coils 101 and 102 are not limited to the above-described aspect.

By contrast, in the second modification as shown in FIG. 6A, the two opposing long sides 101a and 101b of the first loop coil 101 may be formed so as to be different in radius of an arc from each other. For example, the first loop coil 101 may be formed such that the radius of an arc of its outer long side 101a is larger than that of its inner long side 101b. Similarly, the second loop coil 102 may be formed such that the radius of an arc of its outer long side 102a is larger than that of its inner long side 102b.

FIG. 6B illustrates a configuration of the static field magnet 10 according to the third modification. Also in the third modification, the upper static field magnet 10A is the same as the lower static field magnet 10B in terms of configuration and structure, and only the upper static field magnet 10A is illustrated.

In the first and second loop coils 101 and 102 of the third modification, the respective inner long sides 101b and 102b in the longitudinal direction are formed into arc shapes with a predetermined radius, whereas the respective outer long sides 101a and 102a in the longitudinal direction are formed as straight lines.

In the above-described second and third modifications, though the first and second loop coils 101 and 102 are not line-symmetric with respect to the respective major axes 301 and 302, the static field magnet 10 as a whole is line-symmetrical with respect to the center axis 300.

Figures 7A, 7B:
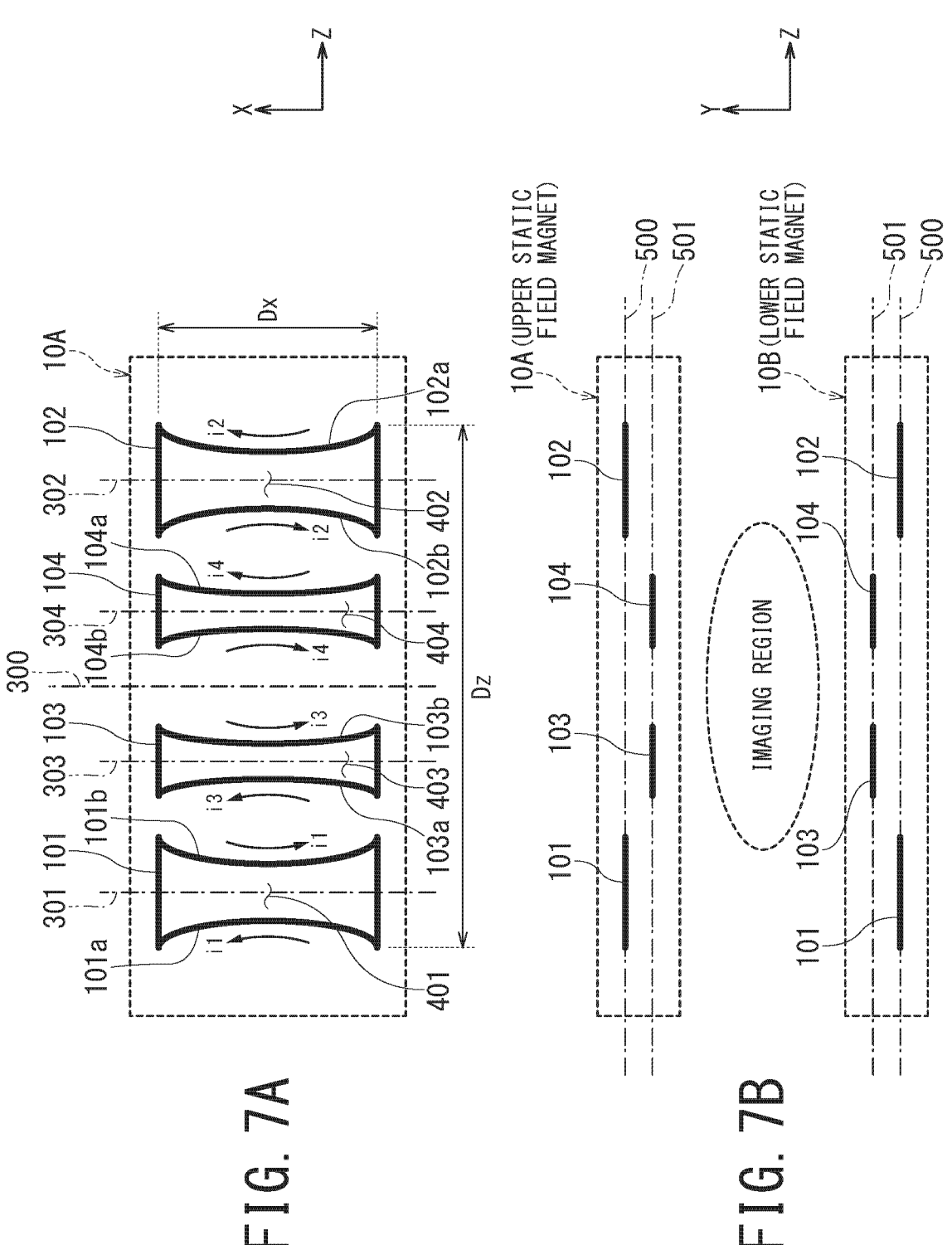
FIG. 7A and FIG. 7B are schematic diagrams illustrating a configuration of the static field magnet according to the fourth modification.

FIG. 7A and FIG. 7B are schematic diagrams illustrating a configuration of the static field magnet 10 according to the fourth modification. Although the static field magnet 10 of the above-described embodiment has one loop coil pair composed of the first and second loop coils 101 and 102 as shown in FIG. 4A and FIG. 4B, the number of loop coil pairs may be two or more.

In the fourth modification shown in FIG. 7A and FIG. 7B, each of the upper and lower static field magnets 10A and 10B includes: a first/second loop coil pair composed of the first loop coil 101 and the second loop coil 102; and a third/fourth loop coil pair composed of a third loop coil 103 and a fourth loop coil 104.

The first/second loop coil pair and the third/fourth loop coil pair are arranged such that the center position of the first/second loop coil pair in the specific direction (i.e., the Z-axis direction) is on the central axis 300 and coincides with the the center position of the third/fourth loop coil pair in the specific direction (i.e., the Z-axis direction).

In the fourth modification as shown in FIG. 7A as well, each of the two opposing long sides 101a and 101b of the first loop coil 101 and the two opposing long sides 102a and 102b of the second loop coil 101 is formed to have an arc-shaped concave portion curved toward the inside of the loop such that the radius of an arc is common to these four long sides 101a, 101b, 102a, and 102b.

Further, each of the two opposing long sides 103a and 103b of the third loop coil 103 and the two opposing long sides 104a and 104b of the fourth loop coil 104 is also formed to have an arc-shaped concave portion curved toward the inside of the loop such that the radius of an arc is common to these four long sides 103a, 103b, 104a, and 104b. In the case of FIG. 7A and FIG. 7B, however, the common radius of an arc of the respective four long sides of the first and second loop coils 101 and 102 is different from the common radius of an arc of the respective four long sides of the third and fourth loop coils 103 and 104.

As to geometry between the first/second specific plane 500 on which the first/second loop coil pair is disposed and the third/fourth specific plane 501 on which the third/fourth loop coil pair is disposed, it is satisfactory if the specific planes 500 and 501 are parallel to each other as shown in FIG. 7B, and the specific planes 500 and 501 do not necessarily have to match each other.

Since a plurality of loop coil pairs are provided, as compared with the case where only one loop coil pair is provided, the degree of freedom of static magnetic field distribution to be formed can be enhanced, and a wider uniform static-magnetic-field region can be obtained.

Figures 8A, 8B:
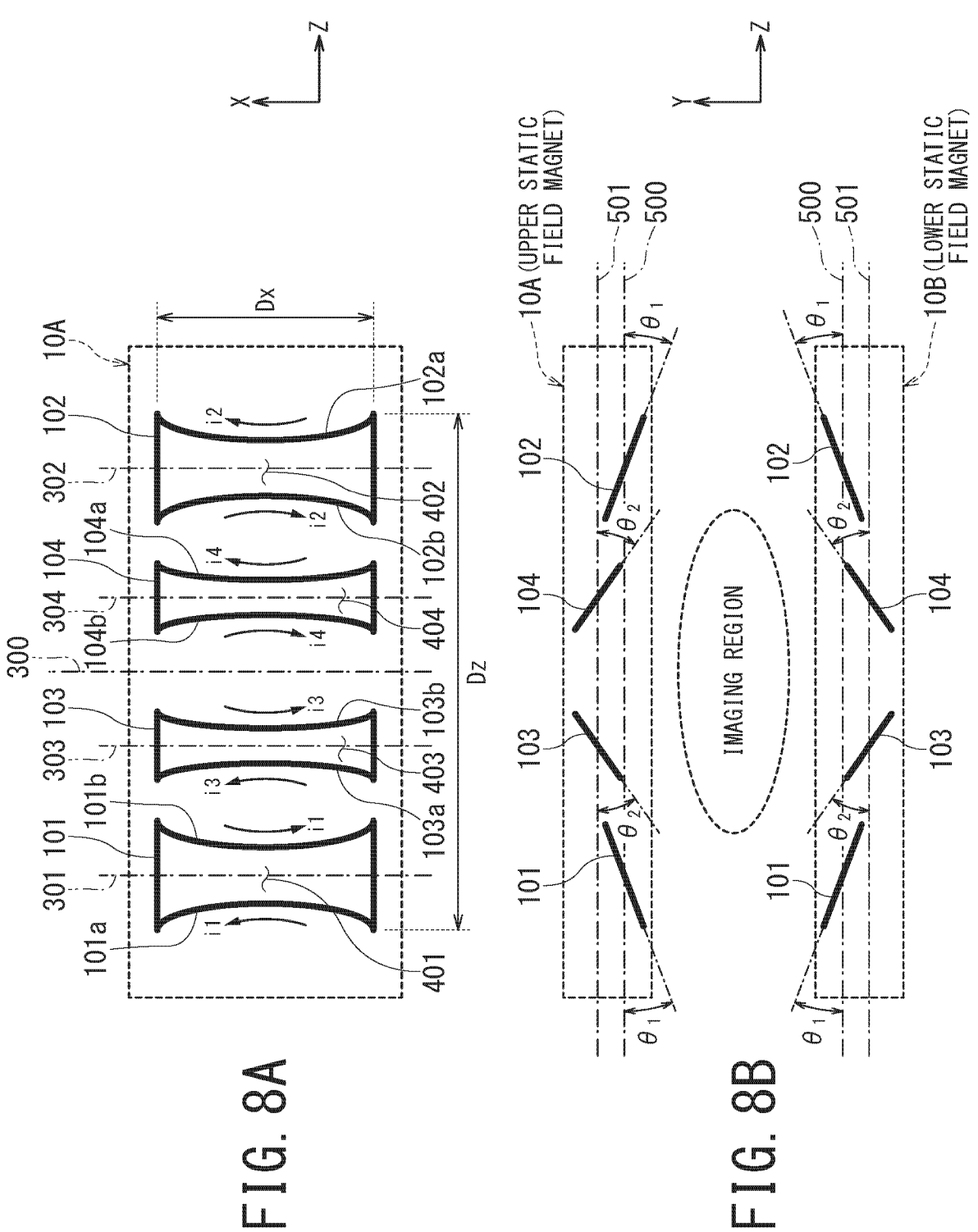
FIG. 8A and FIG. 8B are schematic diagrams illustrating a configuration of the static field magnet according to the fifth modification.

FIG. 8A and FIG. 8B are schematic diagrams illustrating a configuration of the static field magnet 10 according to the fifth modification. In the above-described static field magnet 10 according to the fourth modification shown in FIG. 7A and FIG. 7B, the first and second loop coils 101 and 102 are arranged such that the first and second coil planes 401 and 402 are parallel to the first/second specific plane 500 and included in the first/second specific plane 500. Similarly, the third and fourth loop coils 103 and 104 are arranged such that the third and fourth coil planes 403 and 404 are parallel to the third/fourth specific plane 501 and included in the third/fourth specific plane 501.

By contrast, in the fifth modification, the first and second loop coils 101 and 102 are arranged such that the first and second coil planes 401 and 402 are tilted with respect to the first/second specific plane 500 at a predetermined tilt angle $\theta_1$ around the respective major axes 301 and 302. Similarly, the third and fourth loop coils 103 and 104 are arranged such that the third and fourth coil planes 403 and 404 are tilted with respect to the third/fourth specific plane 501 at a predetermined tilt angle $\theta_2$ around the respective major axes 303 and 304. The tilt angle $\theta_1$ and the tilt angle $\theta_2$ may be the same or different.

In the fifth modification, each of the coil planes 401, 402, 403, and 404 has the tilt angle $\theta_1$ or $\theta_2$ with respect to the specific plane 500 or 501, which enhances the degree of freedom of static magnetic field distribution to be formed and enables formation of a wider uniform static-magnetic-field region as compared with the third modification.

Figure 9A:
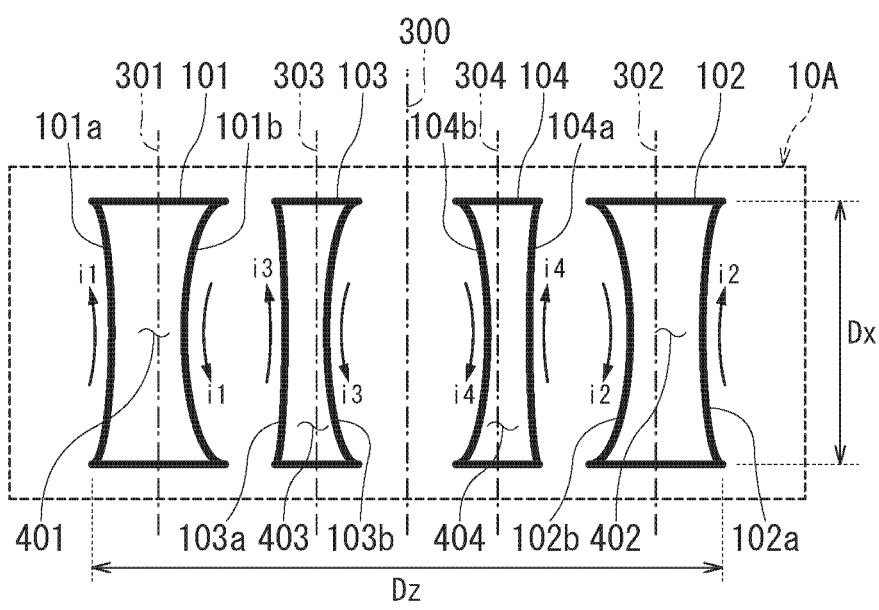
FIG. 9A is a schematic diagram illustrating a configuration of the static field magnet according to the sixth modification.

FIG. 9A illustrates a configuration of the static field magnet 10 according to the sixth modification. In the static field magnet 10 of the sixth modification, similarly to the third modification (FIG. 3A), for example, the first loop coil 101 is formed such that its outer long side 101a in the longitudinal direction is smaller in radius of an arc than its inner long side 101b, and the second loop coil 102 is formed such that its outer long side 102a in the longitudinal direction is smaller in radius of an arc than its inner long side 102b.

Similarly, for example, the third loop coil 103 is formed such that its outer long side 103a in the longitudinal direction is smaller in radius of an arc than its inner long side 103b, and the fourth loop coil 104 is formed such that its outer long side 104a in the longitudinal direction is smaller in radius of an arc than its inner long side 104b.

Figure 9B:
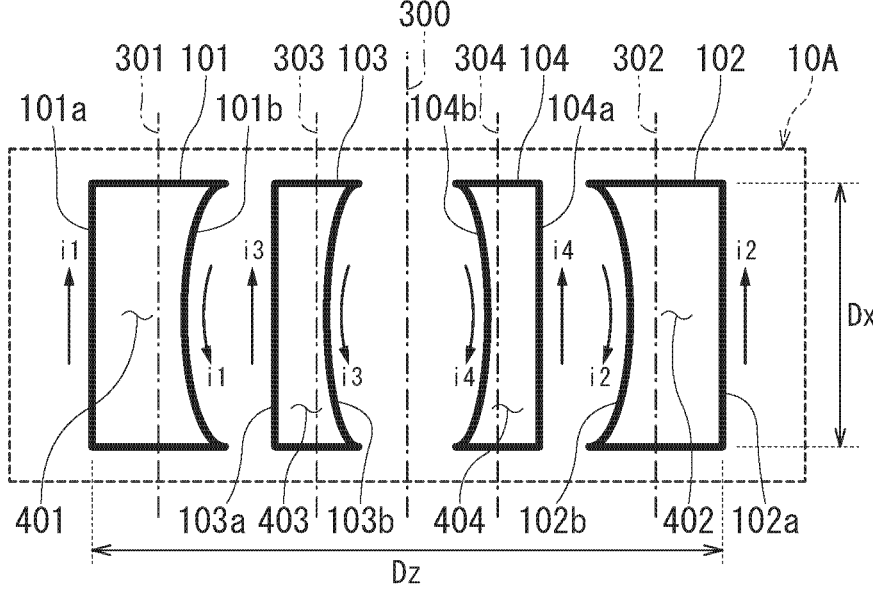
FIG. 9B is a schematic diagram illustrating a configuration of the static field magnet according to the seventh modification.

FIG. 9B illustrates a configuration of the static field magnet 10 according to the seventh modification. In the first and second loop coils 101 and 102 of the static field magnet 10 of the seventh modification, the respective inner long sides 101b and 102b in the longitudinal direction are formed into arc shapes with a predetermined radius, whereas the respective outer long sides 101a and 102a in the longitudinal direction are formed as straight lines, similarly to the fourth modification (FIG. 7B).

Similarly, in the third and fourth loop coils 103 and 104, the respective inner long sides 103b and 104b in the longitudinal direction are formed into arc shapes with a predetermined radius, whereas the respective outer long sides 103a and 104a in the longitudinal direction are formed as straight lines.

In the above-described sixth and seventh modifications, though the first to fourth loop coils 101, 102, 103, and 104 are not line-symmetric with respect to the respective major axes 301, 302, 303, and 304, the static field magnet 10 as a whole is line-symmetric with respect to the center axis 300.

Figures 10A, 10B:
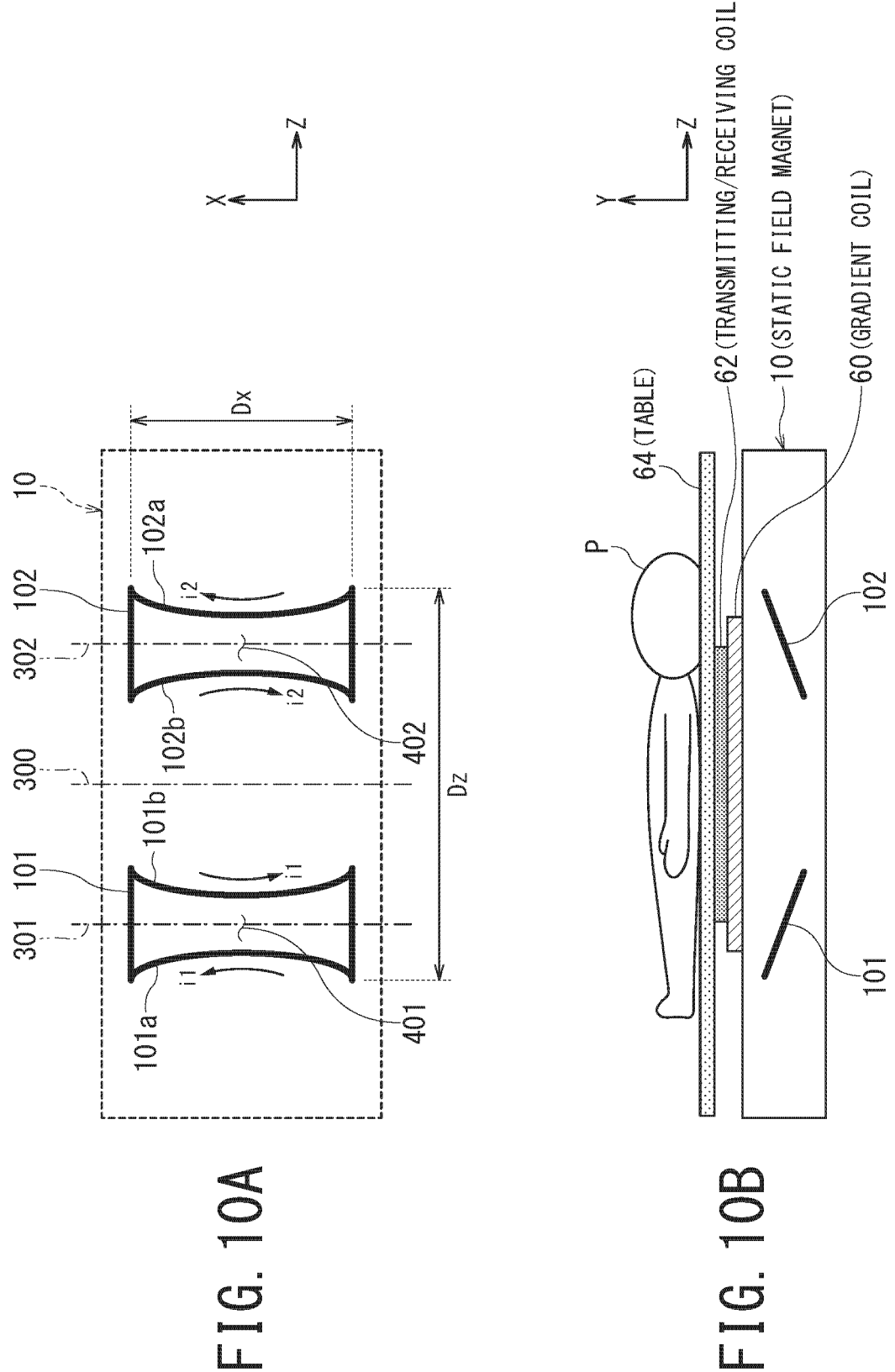
FIG. 10A and FIG. 10B are schematic diagrams illustrating a configuration of the static field magnet according to the eighth modification.

FIG. 10A and FIG. 10B are schematic diagrams illustrating a configuration of the static field magnet 10 according to the eighth modification. The static field magnet 10 of any one of the above-described embodiment and the first to seventh modifications includes the upper and lower static field magnets 10A and 10B and is provided with the imaging region in the space between the upper and lower static field magnets 10A and 10B.

By contrast, the static field magnet 10 of the eighth modification includes only one of the upper and lower static field magnets 10A and 10B, for example, includes only the lower static field magnet 10B as shown in FIG. 10A and FIG. 10B. The lower static field magnet 10B of any one of the above-described embodiment and the first to seventh modifications may be used as the static field magnet 10 of the eighth modification. In the configuration of FIG. 10A and FIG. 10B, the lower static field magnet 10B of the first modification (FIG. 5A and FIG. 5B) is used as the static field magnet 10 of the eighth modification.

In the static field magnet 10 according to the eighth modification, the static magnetic field generated in the region above the static field magnet 10 is used for imaging the object P. In other words, the imaging region is set spatially above the static field magnet 10. FIG. 10B also illustrates the table 64 on which the object P lies, a gradient coil 60 provided between the table 64 and the static field magnet 10, and a transmitting/receiving coil 62.

Distribution of the static magnetic field generated by the eighth modification is uniformized in both the specific direction (which is the direction orthogonal to each of the two major axes 301 and 302, i.e., is the Z-axis direction in FIG. 10B) and the direction (i.e., X-axis direction in FIG. 10A) that is parallel to the specific plane (i.e., the plane including the two major axes 301 and 302) and orthogonal to the specific direction, and varies monotonously in the direction orthogonal to the specific plane (i.e., in the Y-axis direction in FIG. 10B).

Figure 11:
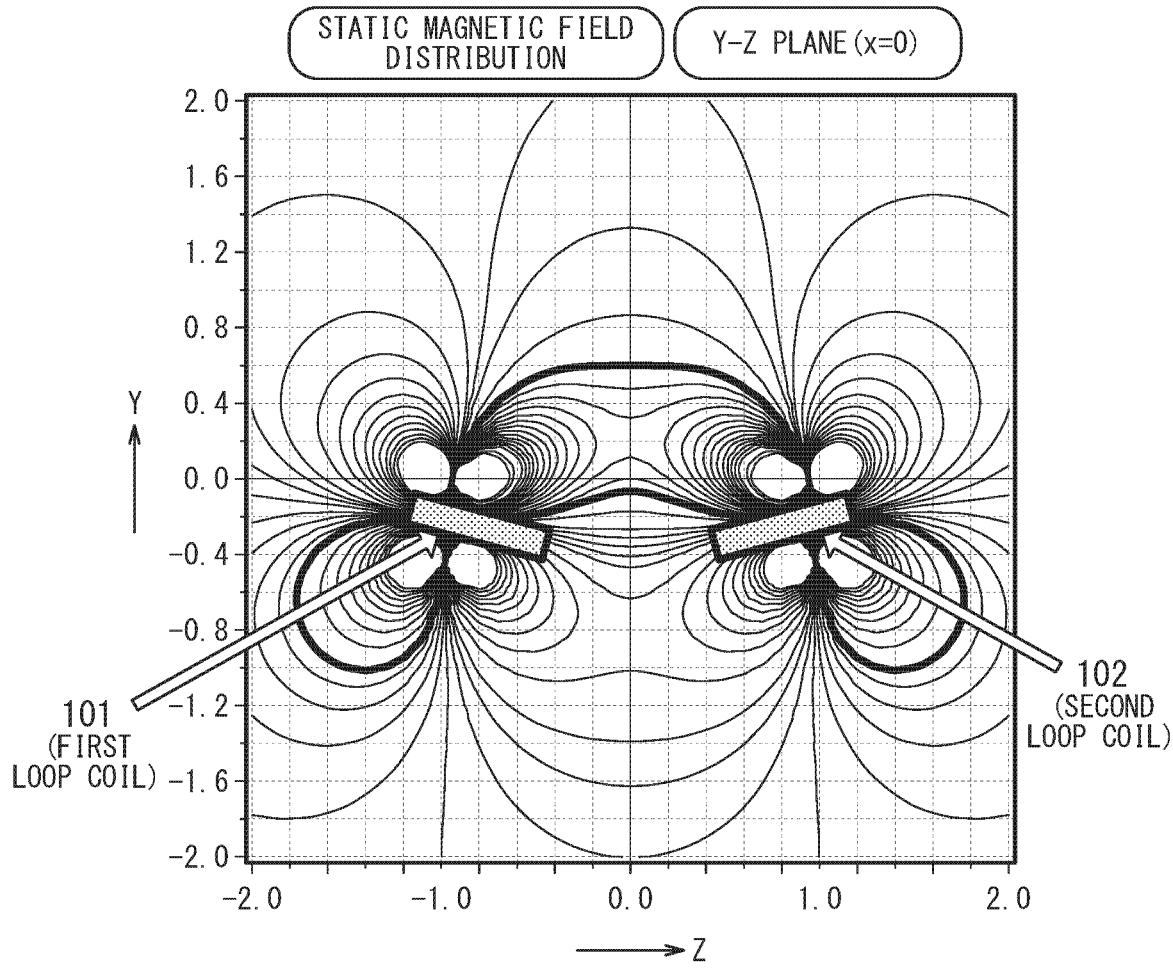
FIG. 11 is a schematic diagram illustrating static magnetic field distribution in a Y-Z plane of the static field magnet.
Figure 12:
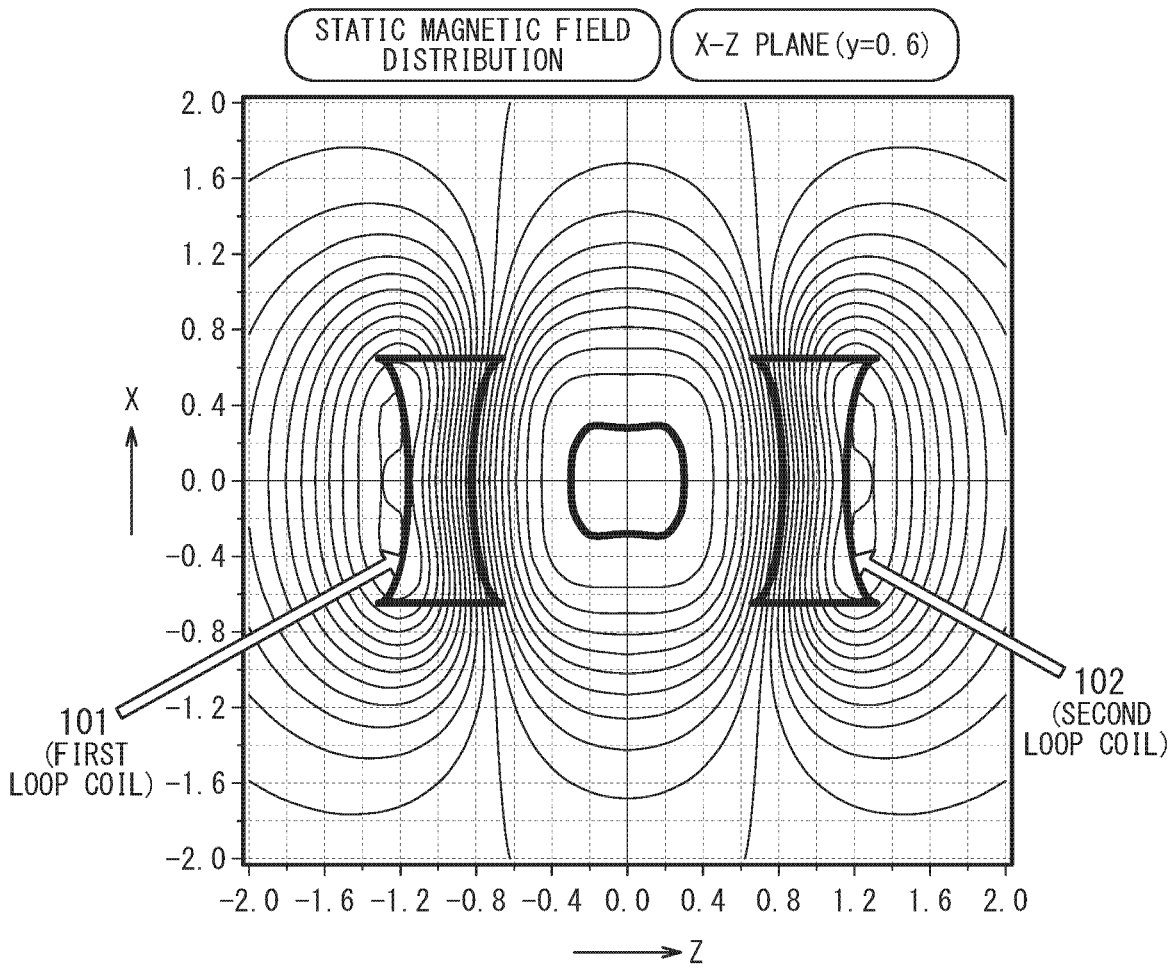
FIG. 12 is a schematic diagram illustrating static magnetic field distribution in an X-Z plane of the static field magnet.
Figure 13:
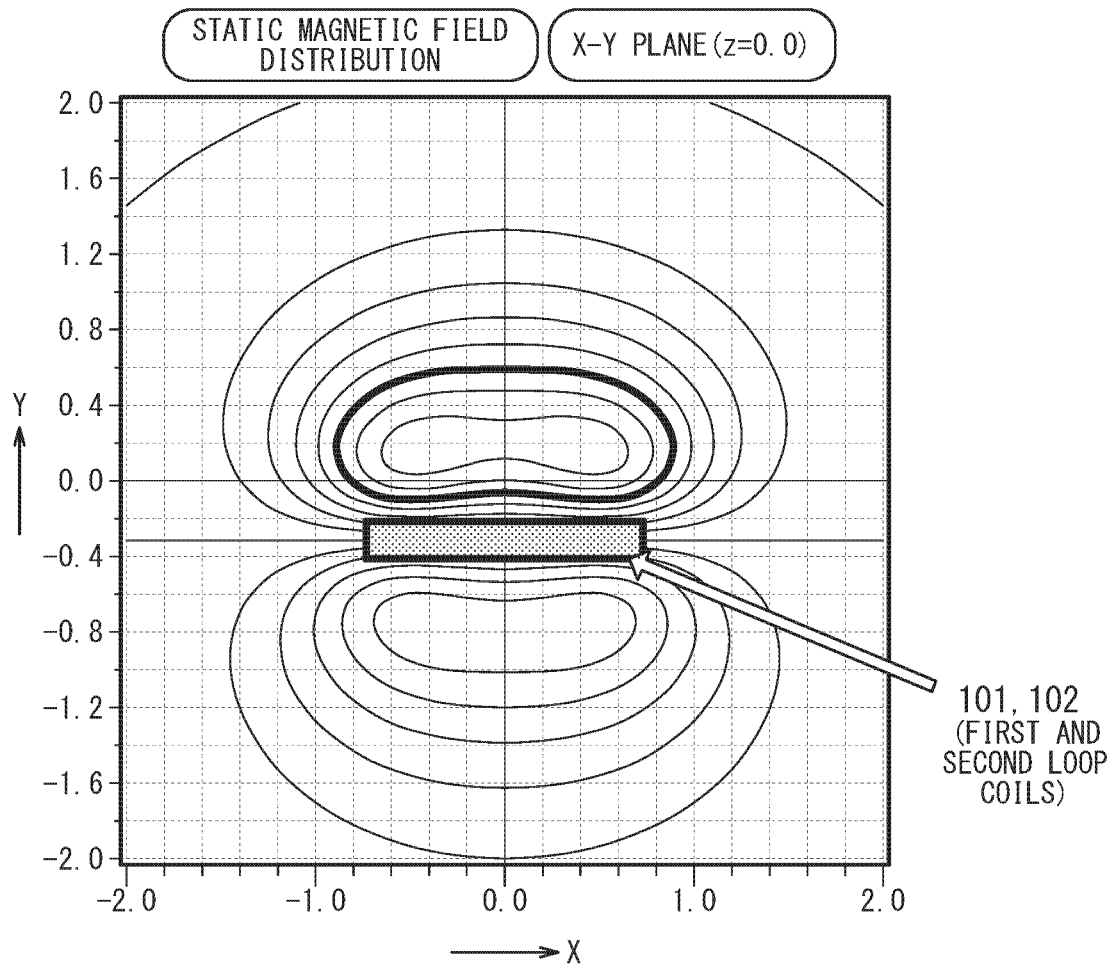
FIG. 13 is a schematic diagram illustrating static magnetic field distribution in an X-Y plane of the static field magnet.

FIG. 11 to FIG. 13 are schematic diagrams illustrating calculated distribution of the static magnetic field generated by the static field magnet 10 according to the eighth modification. FIG. 11 shows the static magnetic field distribution in the Y-Z plane when the value of the X-axis is zero, i.e., in the Y-Z plane at the central position of the static field magnet 10 in the lateral direction. The curves in FIG. 11 represent the static magnetic field strength as contour lines. In FIG. 11, the horizontal axis indicates the position in the normalized Z-axis direction, and the vertical axis indicates the position in the normalized Y-axis direction.

In the calculation result shown in FIG. 11, the center position (z, y) of the first loop coil 101 is (−1.0, −0.3), and the center position (z, y) of the second loop coil 102 is (+1.0, −0.3). In this calculation result, the magnetic field strength in the Z-axis direction is uniformized in the predetermined range that is centered at y=0.6 and between −0.3 and +0.3 in the Z-axis position, and this region is selected as the imaging region. In the imaging region, the static magnetic field is formed such that the magnetic field strength varies monotonously in the Y-axis direction (i.e., the direction orthogonal to the table 64).

FIG. 12 shows the static magnetic field distribution in the X-Z plane at y=0.6. In the X-Z plane, the imaging region is an approximately square region between −0.3 and +0.3 in the X-axis position and between −0.3 and +0.3 in the Z-axis position. In the X-Z plane of the imaging region, the magnetic field strength is uniformized in both the X-axis direction and the Z-axis direction.

FIG. 13 shows the static magnetic field distribution in the X-Y plane at z=0. In the X-Y plane, the imaging region is a predetermined range that is centered at y=0.6 and between −0.3 and +0.3 in the X-axis position. In the X-Y plane of the imaging region, static magnetic field distribution is formed such that the magnetic field strength is uniformized in the X-axis direction while varying monotonously in the Y-axis direction.

Figures 14A, 14B:
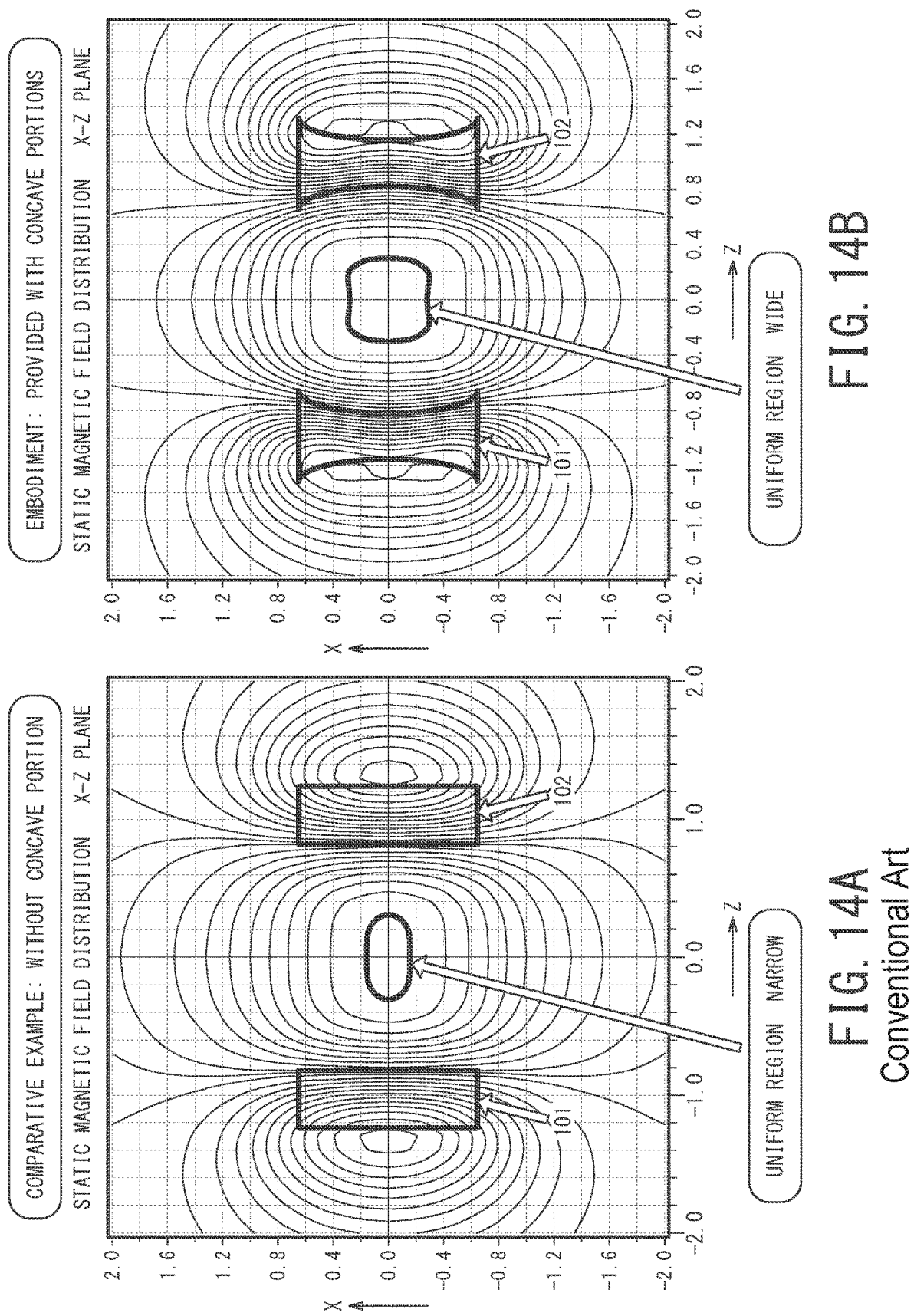
FIG. 14A and FIG. 14B are schematic diagrams illustrating that a uniform region of the static magnetic field distribution in the X-Z plane differs depending on the respective shapes of first and second loop coils.

FIG. 14A and FIG. 14B schematically illustrate that the respective uniform regions of the static magnetic field distribution in the X-Z plane differ depending on the respective shapes of the first and second loop coils 101 and 102.

FIG. 14A shows the static magnetic field distribution when the shapes of the first and second loop coils 101 and 102 are both rectangular as a comparative (or a conventional) example for the static field magnet 10 of the embodiment. In the magnet unit 10 of the comparative example, every long side of the first and second loop coils 101 and 102 is a straight line. The uniform region (i.e., the region surrounded by the thick solid line in the center of FIG. 14A) of static magnetic field distribution obtained by the conventional first and second loop coils 101 and 102 is the region surrounded by the contour lines of predetermined magnetic field strength, and is a rectangular region that is long in the Z-axis direction and short in the X-axis direction.

By contrast, in FIG. 14B, the uniform region of static magnetic field distribution obtained by the first and second loop coils 101 and 102 of the embodiment is shown by the thick solid line shown in the center of FIG. 14B. The uniform region shown in FIG. 14B is the region surrounded by contour lines of the same magnetic field strength as the uniform region in the comparative example, and has a substantially square shape in which the length in the Z-axis direction and the length in the X-axis direction are approximately the same.

As is clear from comparison between FIG. 14A and FIG. 14B, a wider uniform region can be obtained in the static magnetic field distribution generated by the first and second loop coils 101 and 102 of the embodiment, in which each long side of the loop is formed to have a concave portion curved toward the inside of the loop, than the static magnetic field distribution generated by the first and second loop coils 101 and 102 of the comparative example, in which each long side of the loop is formed to be a straight line (i.e., the loop is formed into a rectangular shape).

The reason for this is as follows. In the magnetic field distribution of the comparative example as shown in FIG. 14A, change in magnetic field strength in the X-axis direction is large in the region around the peak of magnetic field strength near the center, and the region where the magnetic field distribution is flat in the X-axis direction is narrow. As a result, the shape of the uniform region is a rectangle that is short in the X-axis direction and long in the Z-axis direction.

By contrast, in the first and second loop coils 101 and 102 according to the embodiment, each long side of the loop is formed to have a concave portion curved toward the inside of the loop, and thus, the magnetic field strength at the central portion in the X-axis direction is reduced, while the magnetic field strength at both ends in the X-axis direction is enhanced. Thus, in the magnetic field distribution of the embodiment as shown in FIG. 14B, in the region around the peak of magnetic field strength near the center, change in magnetic field strength in the X-axis direction can be reduced, and the region where the magnetic field distribution is flat in the X-axis direction can be expanded. Hence, the shape of the uniform region can be an approximately square shape that is long in both the X-axis direction and the Z-axis direction. Consequently, in the static field magnet 10 provided with the first and second loop coils 101 and 102 according to the embodiment, the uniform region of the magnetic field distribution can be expanded with respect to the comparative example.

MRI Apparatus

Figure 15:
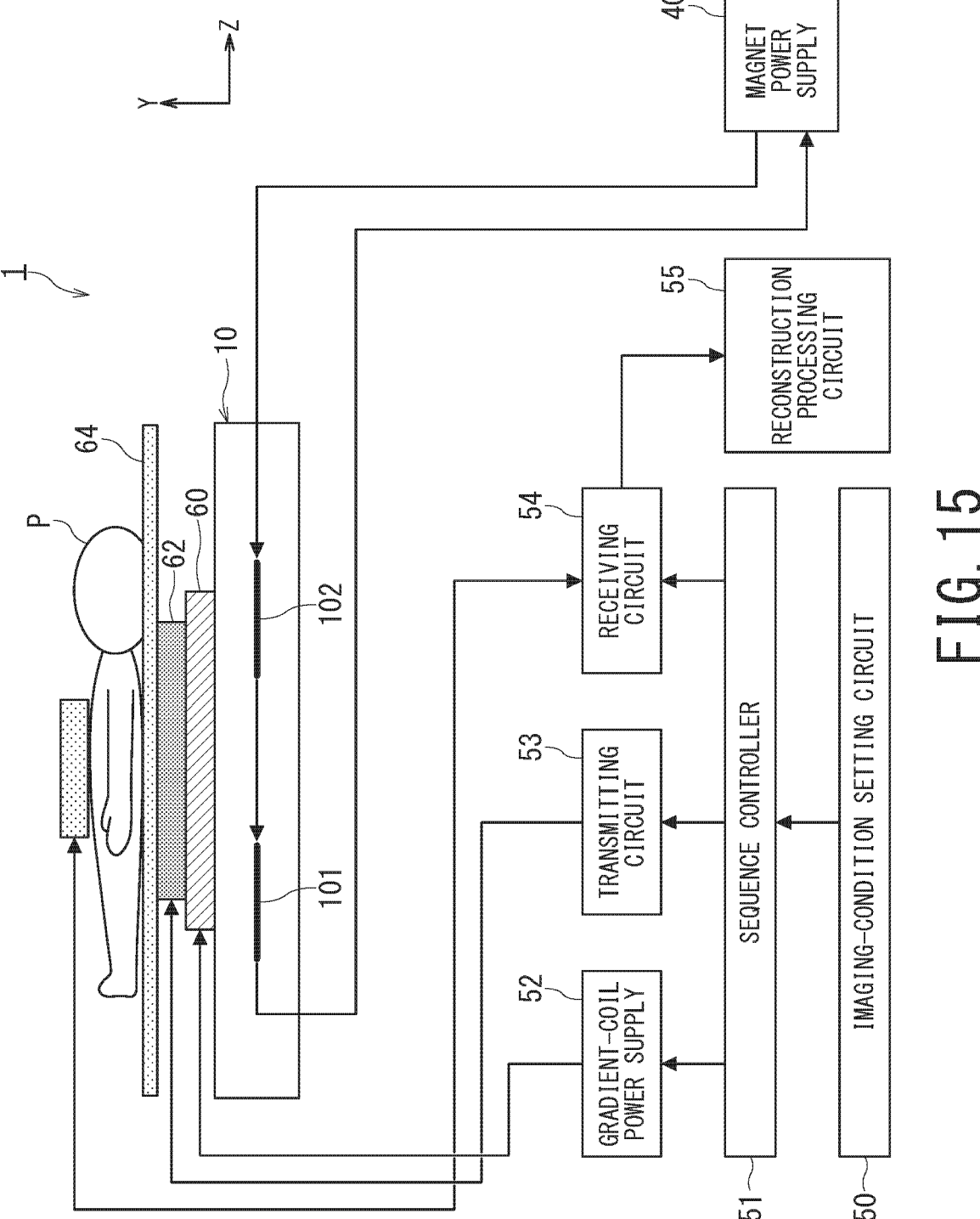
FIG. 15 is a schematic diagram illustrating a configuration of an MRI apparatus that includes the static field magnet according to one of the present embodiment and its modifications.

FIG. 15 is a schematic diagram illustrating a configuration of the MRI apparatus 1 that includes the static field magnet 10 of one of the above-described embodiment and its modifications. From among the static field magnets 10 according to the above-described embodiment and its respective modifications, the static field magnet 10 of the eighth modification having only the lower static field magnet 10B is adopted in the MRI apparatus 1 shown in FIG. 15.

The MRI apparatus 1 includes the static field magnet 10, the gradient coil 60, the transmitting/receiving coil 62, the table 64, the magnet power supply 40, an imaging-condition setting circuit 50, a sequence controller 51, a gradient-coil power supply 52, a transmitting circuit 53, a receiving circuit 54, and a reconstruction processing circuit 55.

The magnet power supply 40 is a power supply that applies electric currents to the respective first and second loop coils 101 and 102 of the static field magnet 10. When the static field magnet 10 is configured as a normal conducting magnet, the magnet power supply 40 is always connected to the static field magnet 10. When the static field magnet 10 is configured as a superconducting magnet, the magnet power supply 40 supplies electric currents to the static field magnet 10 in an excitation mode, and then is disconnected from the static field magnet 10 after the static field magnet 10 shifts to the persistent current mode.

The imaging-condition setting circuit 50 sets and/or selects imaging conditions, such as a type of pulse sequence and values of various parameters inputted via a user interface (not shown), on the sequence controller 51. The sequence controller 51 performs a scan of the object by driving the gradient-coil power supply 52 and the transmitting circuit 53 based on the selected imaging conditions.

The gradient-coil power supply 52 applies gradient magnetic field currents to the gradient coil 60 based on a drive signal from the sequence controller 51. The transmitting circuit 53 generates an RF pulse based on the drive signal from the sequence controller 51, and applies the RF pulse to the transmitting/receiving coil 62. Each MR signal emitted from the object P in response to application of the RF pulse is received by, for example, a local RF coil attached to the chest of the object P. The MR signals received by the local RF coil are converted from analog signals into digital signals by the receiving circuit 54. The MR signals converted into the digital signals are inputted as k-space data to the reconstruction processing circuit 55. The reconstruction processing circuit 55 performs reconstruction processing such as inverse Fourier transform on the k-space data to generate a magnetic resonance image.

According to at least one embodiment described above, in imaging with the use of an open-type static field magnet, both easy access to the object during imaging and a widely secured imaging region in the head-foot direction of the object can be achieved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A static field magnet used in an MRI apparatus configured to image an object, the static field magnet comprising:

at least one loop coil pair including a first loop coil configured to be supplied with an electric current in a first direction, and a second loop coil configured to be supplied with an electric current in a second direction opposite to the first direction, wherein:

the first loop coil and the second loop coil are arranged in such a manner that a first coil plane and a second coil plane are along a specific direction included in a specific plane without overlapping each other, the first coil plane being a planar area surrounded by a first loop that forms the first loop coil, and the second coil plane being a planar area surrounded by a second loop that forms the second loop coil;

the loop coil pair is configured to generate a static magnetic field parallel to the specific direction; and each of the first loop coil and the second loop coil is formed into a shape of a deformed rectangle that has two opposing long sides and two opposing short sides in such a manner that a side of the two opposing long sides is curved toward an inside of the deformed rectangle and an other side of the two opposing long sides is curved toward an inside of the deformed rectangle or is formed as a straight line.

2. The static field magnet according to claim 1, wherein each of the first loop coil and the second loop coil is formed in a line-symmetrical shape with respect to a center line that is set on the specific plane and set at a center between the first loop coil and the second loop coil.

3. The static field magnet according to claim 1, wherein each of the two opposing long sides is formed as an arc curved inward.

4. The static field magnet according to claim 3, wherein each of the first loop coil and the second loop coil is formed in such a manner that the two opposing long sides are different in radius of an arc from each other.

5. The static field magnet according to claim 1, wherein the first loop coil and the second loop coil are arranged in such a manner that the first loop and the second loop are in the specific plane and parallel to each other.

6. The static field magnet according to claim 1, wherein the first loop coil and the second loop coil are arranged in such a manner that the first coil plane and the second coil plane are included in the specific plane.

7. The static field magnet according to claim 1, wherein the first loop coil and the second loop coil are arranged in such a manner that the first coil plane and the second coil plane are tilted with respect to the specific plane at a predetermined tilt angle.

8. The static field magnet according to claim 7, wherein the tilt angle of the first coil plane with respect to the specific plane and the tilt angle of the second coil plane with respect to the specific plane are opposite in direction to each other.

9. The static field magnet according to claim 1, wherein the at least one loop coil pair comprises a plurality of loop coil pairs; and the plurality of loop coil pairs are arranged along the specific direction in such a manner that respective lengths of each of the plurality of loop coil pairs in the specific direction are different and a central position of each of the plurality of loop coil pairs lies in a same position in the specific direction.

10. The static field magnet according to claim 1, wherein the first loop coil and the second loop coil are arranged in such a manner that a distribution of the static magnetic field in an imaging region of the object is uniformized in both the specific direction and a direction parallel to the specific plane and orthogonal to the specific direction and varies monotonously in a direction orthogonal to the specific plane.

11. The static field magnet according to claim 1, wherein:
the at least one loop coil pair comprises a first loop coil pair and a second loop coil pair;

the first loop coil pair is disposed in a first specific plane;

the second loop coil pair is disposed in a second specific plane; and the second specific plane is parallel to the first specific plane and has predetermined separation distance from the first specific plane.

12. The static field magnet according to claim 11, wherein the first loop coil pair and the second loop coil pair are arranged in such a manner that a distribution of the static magnetic field in an imaging region of the object is uniformized in three orthogonal directions including (a) the specific direction, (b) a direction that is parallel to either the first specific plane or the second specific plane and is orthogonal to the specific direction, and (c) a direction orthogonal to either the first specific plane or the second specific plane.

13. The MRI apparatus comprising the static field magnet according to claim 1.

* * * * *